(12) United States Patent
Jung et al.

(10) Patent No.: US 10,199,225 B2
(45) Date of Patent: Feb. 5, 2019

(54) SUBSTRATE PROCESSING APPARATUS

(71) Applicant: EUGENE TECHNOLOGY CO., LTD., Yongin-Si, Gyeonggi-Do (KR)

(72) Inventors: Woo Duck Jung, Suwon-Si (KR); Sung Tae Je, Yongin-Si (KR); Kyu Jin Choi, Yongin-Si (KR); Seong Min Han, Yongin-Si (KR)

(73) Assignee: EUGENE TECHNOLOGY CO., LTD. (KR)

( * ) Notice: Subject to any disclaimer, the term of this patent is extended or adjusted under 35 U.S.C. 154(b) by 0 days.

(21) Appl. No.: 15/566,695

(22) PCT Filed: Apr. 12, 2016

(86) PCT No.: PCT/KR2016/003862
§ 371 (c)(1),
(2) Date: Oct. 13, 2017

(87) PCT Pub. No.: WO2016/167555
PCT Pub. Date: Oct. 20, 2016

(65) Prior Publication Data
US 2018/0090322 A1    Mar. 29, 2018

(30) Foreign Application Priority Data
Apr. 14, 2015 (KR) .................. 10-2015-0052534

(51) Int. Cl.
*H01L 21/205* (2006.01)
*H01L 21/02* (2006.01)
(Continued)

(52) U.S. Cl.
CPC ............ *H01L 21/205* (2013.01); *C23C 16/00* (2013.01); *H01L 21/02* (2013.01); *H01L 21/673* (2013.01); *H01L 21/02041* (2013.01)

(58) Field of Classification Search
CPC .................... H01L 21/02041; H01L 21/205
See application file for complete search history.

(56) References Cited

U.S. PATENT DOCUMENTS

| 8,741,063 B2 * | 6/2014 | Yamazaki | ............. C23C 16/405 |
| | | | 118/715 |
| 2014/0206204 A1 * | 7/2014 | Nakagawa | ............. F01K 25/14 |
| | | | 438/795 |
| 2014/0345801 A1 | 11/2014 | Yang et al. | |

FOREIGN PATENT DOCUMENTS

| JP | H06124912 A | 5/1994 |
| JP | 2006080098 A | 3/2006 |

(Continued)

OTHER PUBLICATIONS

International Search Report for PCT/KR2016/003862 dated Jul. 19, 2016.

(Continued)

*Primary Examiner* — Caridad Everhart
*Assistant Examiner* — Ankush Singal
(74) *Attorney, Agent, or Firm* — Renaissance IP Law Group LLP

(57) ABSTRACT

Provided is a substrate processing apparatus. The substrate processing apparatus includes a first tube defining an inner space, a substrate holder in which a plurality of substrates are vertically stacked in the inner space of the first tube, the substrate holder defining a plurality of processing spaces in which the substrates are individually processed, a gas supply unit having a plurality of main injection holes each of which is vertically defined to correspond to each of the processing spaces to supply a gas into the first tube, and an exhaust unit configured to exhaust the gas supplied into the plurality of processing spaces in the first tube to the outside. The exhaust unit includes a plurality of exhaust holes facing the main injection holes and vertically arranged in a line to corre- (Continued)

spond to the processing spaces. Therefore, the gas may smoothly flow on the substrate.

11 Claims, 9 Drawing Sheets

(51) Int. Cl.
*H01L 21/673* (2006.01)
*C23C 16/00* (2006.01)

(56) References Cited

FOREIGN PATENT DOCUMENTS

| | | |
|---|---|---|
| JP | 2006179819 A | 7/2006 |
| JP | 2007158358 A | 6/2007 |
| JP | 2009016532 A | 1/2009 |
| JP | 2010018889 A | 1/2010 |
| JP | 2010050439 A | 3/2010 |
| JP | 2012004409 A | 1/2012 |
| JP | 2015503227 A | 1/2015 |
| KR | 20070096875 A | 10/2007 |
| KR | 20100010906 A | 2/2010 |
| KR | 20130079231 A | 7/2013 |
| KR | 101364701 B1 | 2/2014 |
| KR | 101392378 B1 | 5/2014 |

OTHER PUBLICATIONS

International Preliminary Report on Patentability for PCT/KR2016/003862 dated Oct. 26, 2017 and the translation of the Written Opinion dated Jul. 19, 2016.

\* cited by examiner

145 : 145a, 145b, 145c
146 : 146a, 146b, 146c

SUBSTRATE PROCESSING APPARATUS

TECHNICAL FIELD

The present disclosure relates to a substrate processing apparatus, and more particularly, to a substrate processing apparatus capable of allowing a gas on a substrate to smoothly flow.

BACKGROUND ART

In general, substrate processing equipment is classified into single wafer type substrate processing equipment capable of processing one substrate at a time and batch type substrate processing equipment capable of processing a plurality of substrates at the same time. The single wafer type substrate processing equipment has a simple structure, but has low productivity. Thus, the batch type substrate processing equipment capable of being mass-producing substrates is being widely used.

The batch type substrate processing equipment includes a processing chamber in which substrates horizontally stacked in multistage are accommodated and processed, a processing gas supply nozzle for supplying a processing gas into the processing chamber, and an exhaust line through which a gas in the processing chamber is exhausted. A substrate processing process using the batch type substrate processing equipment may be performed as follows. First, a plurality of substrates are loaded in the processing chamber. Then, while a gas within the processing chamber is exhausted through the exhaust line, a processing gas is supplied into the processing chamber through the processing gas supply nozzle. Here, the processing gas injected from the processing gas supply nozzle is introduced into the exhaust line through an exhaust hole while passing between the substrates to form a thin film on each of the substrates.

However, in the substrate processing apparatus according to the related art, the processing gas injected from the supply nozzle is introduced to the exhaust hole without being uniformly distributed on the substrate. That is, the processing gas passing through a central portion of the substrate flows slowly, and the processing gas passing through an outer portion of the substrate flows fast. Thus, a difference in film thickness between the thin film on the central portion of the substrate and the thin film on the outer portion of the substrate may occur to deteriorate quality of the substrate or the thin film on the substrate.

DISCLOSURE OF THE INVENTION

Technical Problem

The present disclosure provides a substrate processing apparatus capable of controlling a flow of a gas so that the gas uniformly flows over an entire area on a substrate.

The present disclosure also provides a substrate processing apparatus capable of forming a thin film having a uniform thickness over an entire area on a substrate.

Technical Solution

In accordance with an exemplary embodiment, a substrate processing apparatus includes: a first tube defining an inner space; a substrate holder in which a plurality of substrates are vertically stacked in the inner space of the first tube, the substrate holder separately defining a plurality of processing spaces in which the substrates are individually processed; a gas supply unit having a plurality of main injection holes each of which is vertically defined to correspond to each of the processing spaces to supply a gas into the first tube; and an exhaust unit configured to exhaust the gas supplied into the plurality of processing spaces in the first tube to the outside, wherein the exhaust unit includes a plurality of exhaust holes facing the main injection holes and vertically arranged in a line to correspond to the processing spaces.

The exhaust holes are provided as one hole having a slit shape extending in a direction that crosses a stacking direction of the substrates, or the exhaust holes may include a plurality of holes arranged in the direction that crosses the stacking direction of the substrates.

The exhaust holes may have widths in the direction that crosses the stacking direction of the substrates at an angle of approximately 35° or less with respect to a vertical central axis of the first tube, and the exhaust holes may be arranged symmetrical to the main injection holes with respect to the central axis.

The exhaust unit may further include an exhaust duct disposed outside the first tube, and the exhaust duct may include: a body part that vertically extends to define a passage through which the gas moves therein, the body part being disposed at a position corresponding to the exhaust holes; and a connection part connected to a lower portion of the body part to communicate with the body part, the connection part having an opened lower portion.

The exhaust unit may further include an exhaust line connected to the exhaust duct to suction the gas, and the plurality of exhaust holes may be arranged in widths gradually increasing in a direction that crosses the stacking direction of the substrate as the exhaust holes are away from a portion at which the exhaust duct is connected to the exhaust line.

The exhaust line may include: a flange connected to a lower portion of each of the first tube and the exhaust duct; an exhaust port disposed on the flange, the exhaust port having one side that communicates with a connection part of the exhaust duct; an exhaust tube having one end that is connected to the other side of the exhaust port; a control valve disposed in the exhaust tube to control a flow rate of the gas in the exhaust tube; and an exhaust pump connected to the other end of the exhaust tube to suction the gas.

The exhaust line may further include: a path switching tube having one end that is connected to the exhaust tube between the control valve and the exhaust pump and the other end that is connected to the gas supply unit; and a path switching valve disposed between the path switching tube and the exhaust tube to switch paths through which the gas moves therebetween.

The substrate processing apparatus may further include a position determining unit formed on a bottom surface of the connection part and a top surface of the flange.

The gas supply unit may further include a plurality of auxiliary injection holes spirally defined to correspond to the processing spaces along a circumference of the first tube.

An amount of gas injected through each of the auxiliary injection holes may be approximately 30% or less of that of gas injected through the main injection hole.

The exhaust unit may further include an auxiliary hole defined in a side surface of the exhaust hole to correspond to the auxiliary injection hole.

The substrate processing apparatus may further include a second tube having an inner space to accommodate the first tube, wherein the exhaust duct may be disposed between the first tube and the second tube.

The exhaust duct may be formed of quartz and is integrated with the first tube.

Advantageous Effects

In accordance with the exemplary embodiments, a flow of a gas introduced into a processing space in which the substrate is processed may be controlled. That is, the flow of the gas may be controlled so that the gas flows fast at the upper side of the central portion of a substrate where the flow of the gas is slow, and the gas flows slowly at the upper side of the outer portion of the substrate where the flow of the gas is fast. Thus, since the gas uniformly flows over an entire area on the substrate, the gas may be uniformly distributed over an entire area on the substrate. Therefore, the substrate that is produced in such a way that a thin film grows in a uniform thickness over an entire area on the substrate or a thin film on the substrate may be improved in quality.

Also, in accordance with the exemplary embodiments, a exhaust duct may be provided to prevent the equipment from being contaminated by the gas. That is, since the moving path of the gas that contaminates the equipment is limited to the inside of the exhaust duct, a phenomenon in which other parts of the equipment are contaminated by the gas may be prevented. Therefore, the maintenance of the equipment may be easy.

MODE FOR CARRYING OUT THE INVENTION

Figure 1:
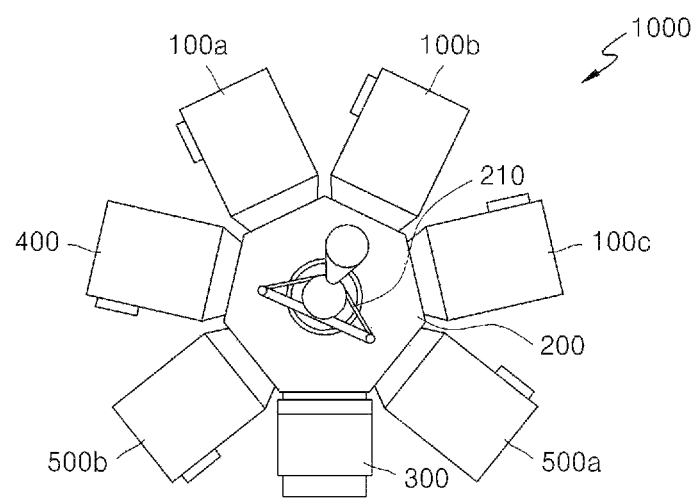
FIG. 1 is a schematic view of substrate processing equipment in accordance with an exemplary embodiment.

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. Like reference numerals refer to like elements throughout.

Figure 2:
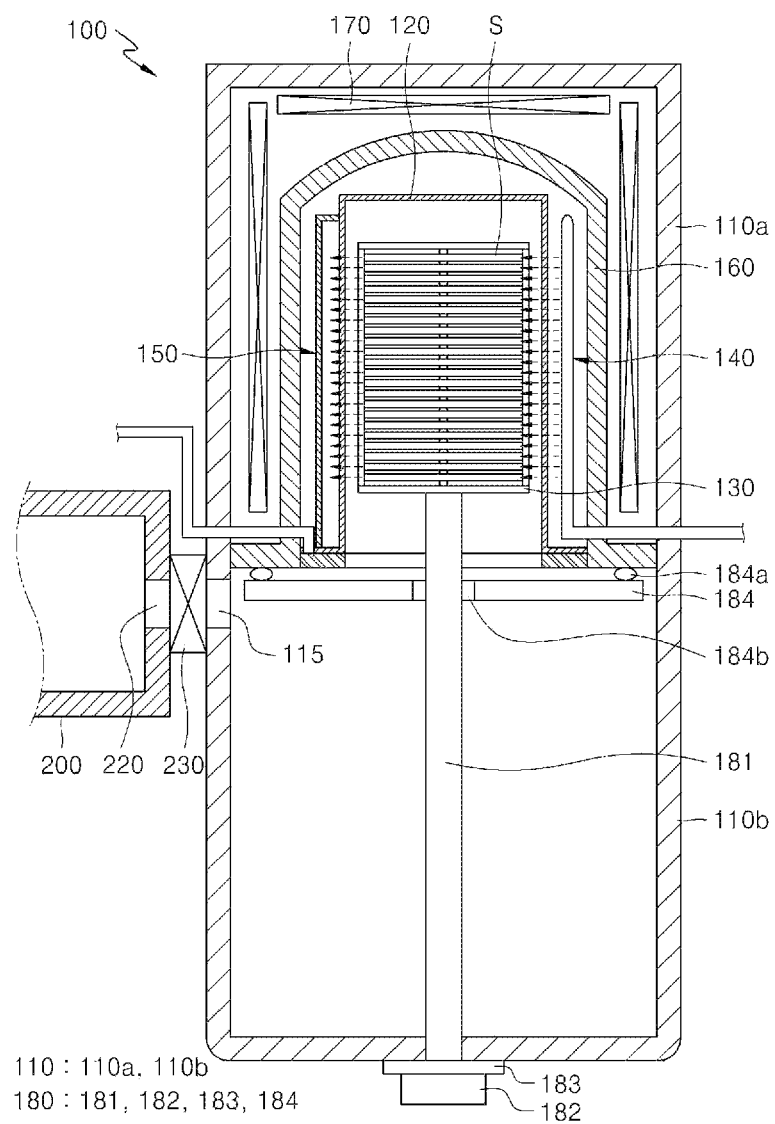
FIG. 2 is a view illustrating a structure of a substrate processing apparatus in accordance with the exemplary embodiment.
Figure 3:
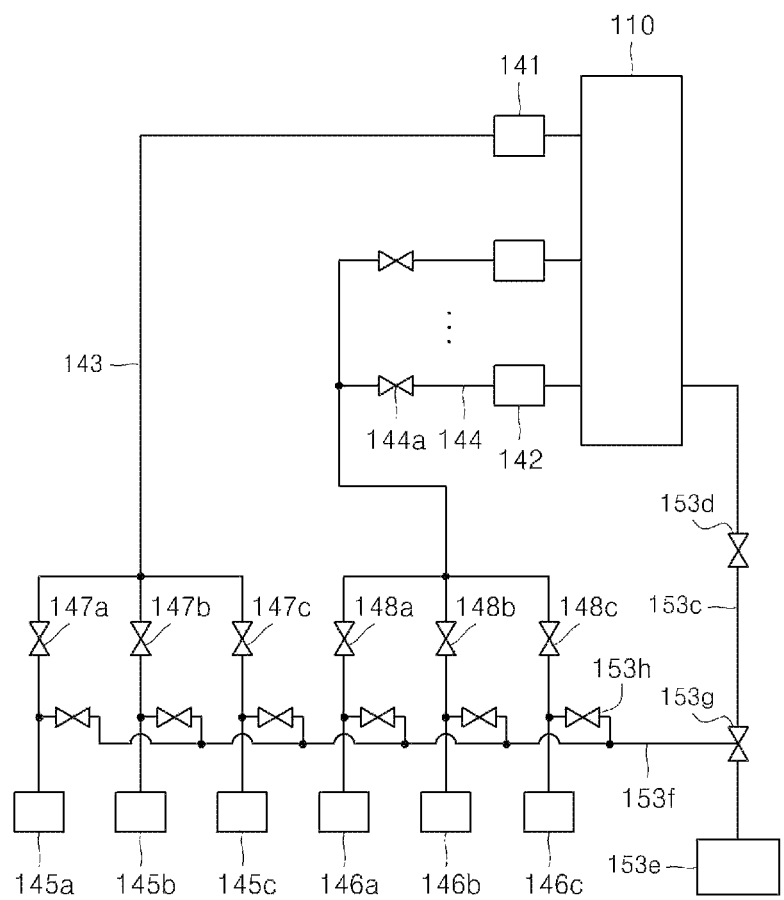
FIG. 3 is a schematic view of an exhaust line and a gas supply line in accordance with the exemplary embodiment.
Figure 4:
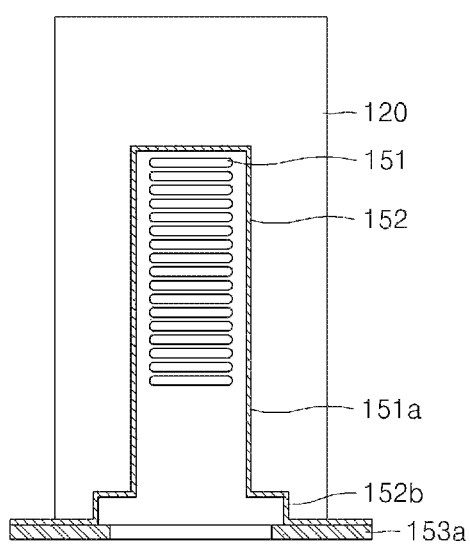
FIG. 4 is a view illustrating a structure of an exhaust hole in accordance with the exemplary embodiment.
Figure 5:
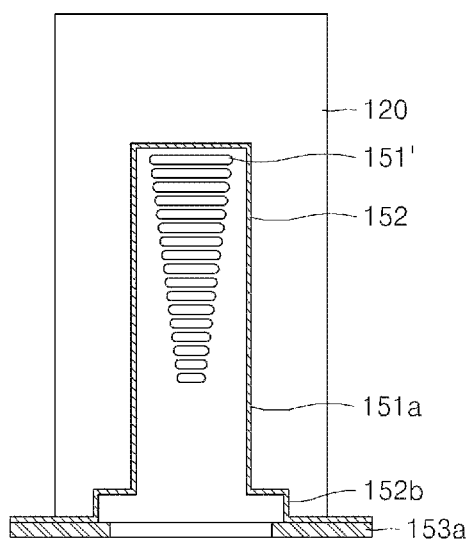
FIG. 5 is a view illustrating a structure of an exhaust hole in accordance with the other exemplary embodiment.
Figure 6:
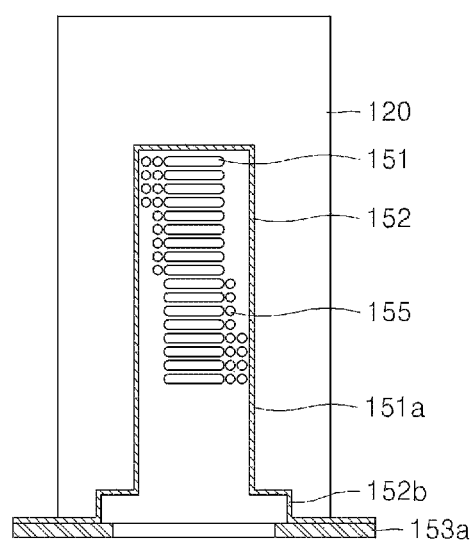
FIG. 6 is a view illustrating a structure of an exhaust hole in accordance with another exemplary embodiment.
Figure 7:
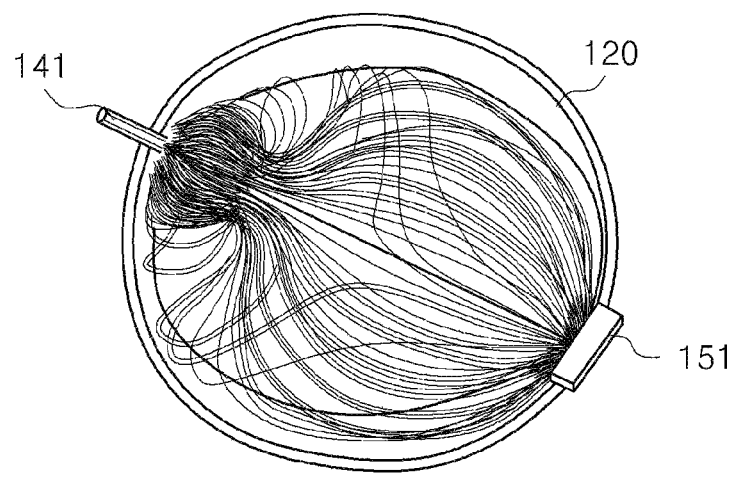
FIG. 7 is a view illustrating a flow of a gas in a processing space in accordance with the exemplary embodiment.
Figure 8:
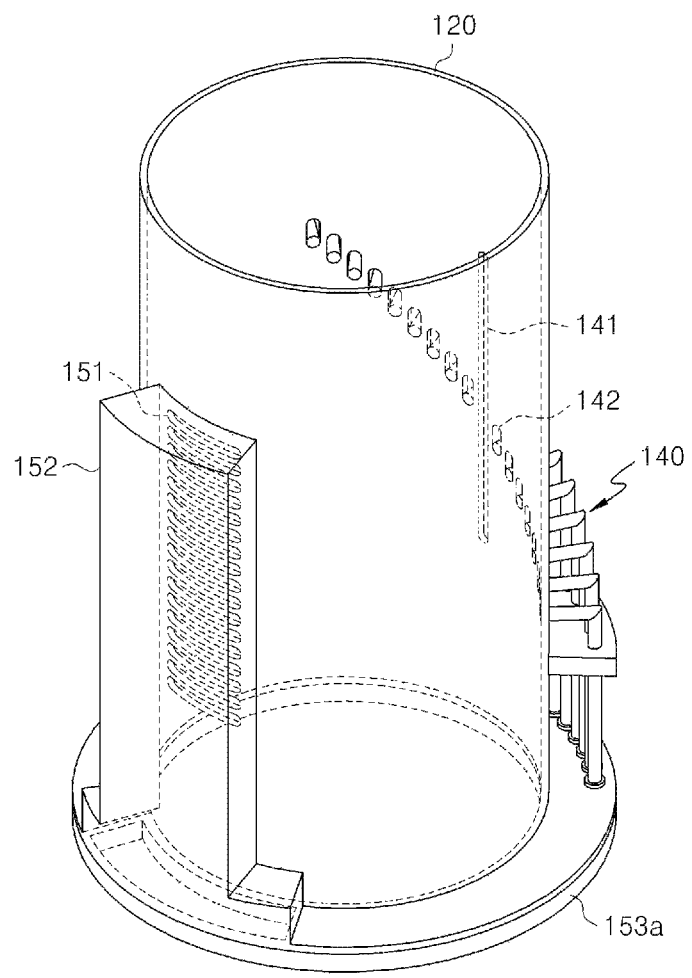
FIG. 8 is a view illustrating a structure of a first tube and an exhaust duct in accordance with the exemplary embodiment.
Figure 9:
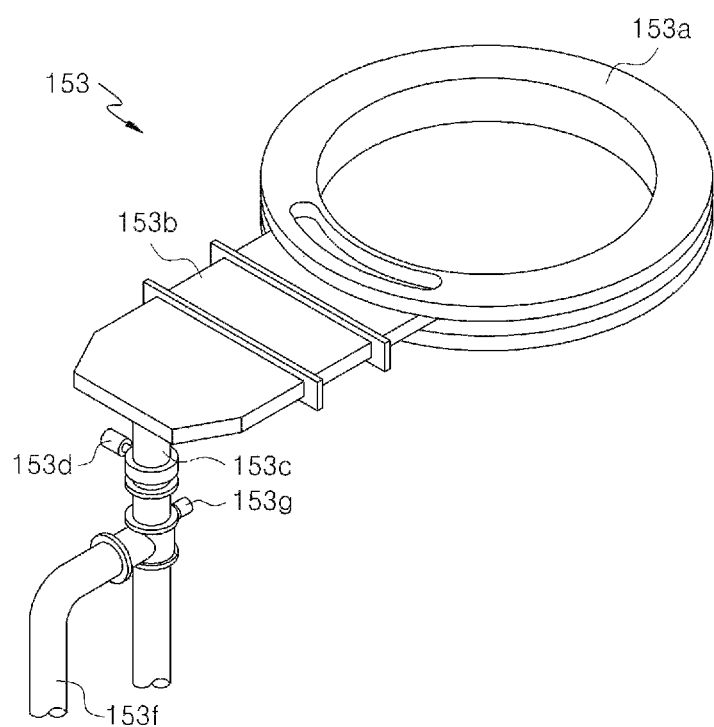
FIG. 9 is a perspective view illustrating a portion of the exhaust line in accordance with the exemplary embodiment.

FIG. 1 is a schematic view of substrate processing equipment in accordance with an exemplary embodiment, FIG. 2 is a view illustrating a structure of a substrate processing apparatus in accordance with the exemplary embodiment, FIG. 3 is a schematic view of an exhaust line and a gas supply line in accordance with the exemplary embodiment, FIG. 4 is a view illustrating a structure of an exhaust hole in accordance with the exemplary embodiment, FIG. 5 is a view illustrating a structure of an exhaust hole in accordance with the other exemplary embodiment, FIG. 6 is a view illustrating a structure of an exhaust hole in accordance with another exemplary embodiment, FIG. 7 is a view illustrating a flow of a gas in a processing space in accordance with the exemplary embodiment, FIG. 8 is a view illustrating a structure of a first tube and an exhaust duct in accordance with the exemplary embodiment, and FIG. 9 is a perspective view illustrating a portion of the exhaust line in accordance with the exemplary embodiment.

A substrate processing apparatus in accordance with an exemplary embodiment includes a first tube 120 defining an inner space, a substrate holder 130 in which a plurality of substrates S are vertically stacked in the inner space of the first tube 120, and a plurality of processing spaces where the substrates S are processed are individually defined, a gas supply unit 140 having a plurality of main injection holes 141 each of which is vertically defined to correspond to each of the processing spaces to supply a gas into the first tube, and an exhaust unit 150 that exhausts the gas supplied into the plurality of processing spaces in the first tube 120 to the outside.

First, substrate processing equipment in accordance with the exemplary embodiment will be exemplarily described to understand the present disclosure.

Referring to FIG. 1, a substrate processing equipment 1000 includes a transfer device 200, a loadlock device 300, cleaning devices 500a and 500b, a buffer device 400, and epitaxial devices 100a, 100b, and 100c. Here, the substrate processing apparatus in accordance with the exemplary embodiment may be the epitaxial devices 100a, 100b, and 100c.

The transfer device 200 has a polygonal shape in a plan view. The loadlock device 300, the cleaning devices 500a and 500b, the buffer device 400, and the epitaxial devices 100a, 100b, and 100c are disposed on side surfaces of the transfer device 200.

The loadlock device 300 is disposed on a side portion of the transfer device 200. The substrate is temporarily stayed in the loadlock device 300 and loaded on the cleaning devices 500a and 500b, the buffer device 400, and the epitaxial devices 100a, 100b, and 100c by the transfer device 200. After the process is completed, the substrate is unloaded by the transfer device 200 and temporarily stayed in the loadlock device 300.

Each of the transfer device 200, the cleaning devices 500a and 500b, the buffer device 400, and the epitaxial devices 100a, 100b, and 100c is maintained in a vacuum state. The loadlock device 300 is switched in condition between a vacuum state and an atmospheric state. The loadlock device 300 may prevent external contaminants from being introduced into the transfer device 200, the cleaning devices 500a and 500b, the buffer device 400, and the epitaxial devices 100a, 100b, and 100c. Also, while the substrate is transferred, the substrate is not exposed to the air, and thus a phenomenon in which an oxide film grows on the substrate may be prevented.

A gate valve (not shown) is disposed between the loadlock device 300 and the transfer device 200. When the substrate S moves between end modules 50, 60, and 70 disposed at a front side of the equipment and the loadlock device 300, the gate valve disposed between the loadlock device 300 and the transfer device 200 is closed.

A substrate handler 210 is disposed on the transfer device 200. The substrate handler 210 may transfer the substrate between the loadlock device 300, the cleaning devices 500a and 500b, the buffer device 400, and the epitaxial devices 100a, 100b, and 100c. When the substrate moves, the transfer device 200 is sealed to be maintained in a vacuum state. Thus, a phenomenon in which the substrate is exposed to contaminants may be prevented.

The cleaning devices 500a and 500b may clean the substrate before an epitaxial process with respect to the substrate is performed in each of the epitaxial devices 100a, 100b, and 100c. To successfully perform the epitaxial process, an amount of oxide existing on the crystalline substrate has to be minimized If a surface oxygen content of the substrate is too high, oxygen atoms may interrupt a crystallographic arrangement of a material that is deposited on the substrate. Thus, the epitaxial process may be harmfully affected. Thus, a cleaning process for removing a natural oxide film (or a surface oxide) formed on the substrate S may be performed in the cleaning devices 500a and 500b.

Each of the epitaxial devices (or the substrate processing apparatus in accordance with the exemplary embodiments) 100a, 100b, and 100c may form an epitaxial layer on the substrate. Here, each of the epitaxial devices 100a, 100b, and 100c may be a selective epitaxial device. In the current exemplary embodiment, three epitaxial devices 100a, 100b, and 100c are provided. Since the epitaxial process takes a lot of time when compared to the cleaning process, a plurality of epitaxial devices may be used to improve manufacturing yields. However, the number of epitaxial devices 100a, 100b, and 100c may not be limited thereto.

Hereinafter, a substrate processing apparatus (or the epitaxial device) 100 in accordance with the exemplary device will be described in detail.

Referring to FIG. 2, the substrate processing apparatus 100 in accordance with the exemplary embodiment includes the first tube 120, the substrate holder 130, the gas supply unit 140, and the exhaust unit 150. Also, the substrate processing apparatus 100 includes a chamber 110 having an internal space, a second tube 160 disposed in the chamber 110 and having an internal space to accommodate the first tube 120, a heating unit 170 disposed to surround the second tube 160, and a support unit 180 connected to the substrate holder 130.

The chamber 110 has a rectangular-parallelepiped or cylindrical shape and internal space. Also, the chamber 110 includes an upper chamber 110a and a lower chamber 110b. The upper chamber 110a and the lower chamber 110b may be vertically communicated with each other. An insertion hole communicating with the transfer device 200 is defined in one side of the lower chamber 110b. Thus, the substrate S may be loaded in the chamber 110 from the transfer device 200 through the insertion hole 115.

An inflow hole 220 is defined in one side of the transfer device 200 corresponding to the insertion hole 115 of the chamber 110. A gate valve 230 is disposed between the inflow hole 220 and the insertion hole 115. Thus, an internal space of the transfer device 200 and the internal space of the chamber 110 may be isolated from each other by the gate valve 230. Also, the inflow hole 220 and the insertion hole 115 may be opened and closed by the gate valve 230. Here, the insertion hole 115 may be defined in the lower chamber 110b. However, the chamber 110 may not be limited to the above-described structures and shapes. That is, the chamber 110 may have various structures and shapes.

The second tube 160 is disposed at an upper side of the lower chamber 110b having an opened upper portion or in the upper chamber 110a. The second tube 160 has the inner space in which the epitaxial process or a selective epitaxial process is performed. The second tube 160 has an opened lower portion. Also, the first tube 120 may be accommodated in the second tube 160.

The first tube 120 may have a cylindrical shape and an opened lower portion. Also, an injection hole 141 of the gas supply unit 140 is defined in one side of a circumferential surface of the first tube 120, and an exhaust hole 151 of the exhaust unit 150 is defined in the other side of the circumferential surface of the first tube 120 facing the injection hole 141. Thus, the gas supplied into the first tube 120 through the injection hole 141 may be exhausted to the outside through the exhaust hole 151. The first tube 120 is disposed in the inner space of the second tube 160. The lower portion of the first tube 120 is connected to a flange 153a that will be described later and thus is supported by the flange 153a. However, the first tube 120 may not be limited to the above-described structures and shapes. That is, the first tube 120 may have various structures and shapes.

The heating unit 170 is disposed in the chamber 110. The heating unit 170 is disposed to surround a side surface and upper portion of the second tube 160 or first tube 120. The heating unit 170 may provide thermal energy to the second tube 160 or the first tube 120 to heat the inner space of the second tube 160 or first tube 120. Thus, a temperature of the inner space of the external tube 120 or the tube 160 may be adjusted to a temperature at which the epitaxial process is capable of being performed.

The substrate holder 130 has a structure in which the plurality of substrates S are vertically stacked and a plurality of processing spaces in which the plurality of substrates are individually processed. That is, in the substrate holder 130, a plurality of layers are vertically defined, and one substrate S is loaded on one layer (or in the processing space).

For example, the substrate holder 130 may include a plurality of protrusions (not shown) that are vertically formed to allow the substrates S to be seated thereon and a plurality of isolation plates (not shown) each of which is disposed at an upper or lower side of each of the protrusions. Thus, the isolation plate may isolate the processing space in which each of the substrate is processed. Therefore, since the processing space of the substrate S is independently defined in each of the layers of the substrate holder 130, a phenomenon in which the processing spaces interfere with each other may be prevented. However, the substrate holder 130 may not be limited to the above-described structures and shapes. That is, the substrate holder 130 may have various structures and shapes.

The support unit 180 includes a shaft 181, a vertical driving part 182, a rotation driving part 183, and a support plate 184. The shaft 181 vertically extends and has an upper end that is connected to a lower portion of the substrate holder 130. The shaft 181 may support the substrate holder 130. The shaft 181 has a lower portion that passes through the lower chamber 110b and that is connected to the vertical driving part 182 and the rotation driving part 183 which are disposed at the outside of the lower chamber 110b.

The vertical driving part 182 is connected to a lower end of the shaft 181 to vertically move the shaft 181. Thus, the substrate holder 130 connected to the upper end of the shaft 181 may vertically move as the shaft 181 moves. For example, according to operation of the vertical driving part 182, the substrate holder 130 may move downward and be disposed in the lower chamber 110b (or at a position at which the substrate is loaded). Thus, the substrate S loaded from the transfer device 200 in the lower chamber 110b may be loaded on the substrate holder 130 disposed in the lower chamber 110b.

When the plurality of substrates S are completely loaded on the substrate holder 130, the substrate holder 130 moves upward by the vertical driving part 182 and be disposed in the inner space of the second tube 160 or first tube 120 (or at a process position). Thus, the epitaxial process with respect to the substrate S may be performed in the inner space of the second tube 160 or first tube 120.

The rotation driving part 183 is connected to the lower end of the shaft 181 that is connected to the substrate holder 130 to rotate the substrate holder 130. The rotation driving part 183 may rotate the shaft 181 with respect to a vertical central axis of the shaft 181. Thus, the substrate holder 130 connected to the shaft 181 may rotate with respect to the vertical central axis. When the processing process of the substrate S is performed, one or more kinds of gases supplied to one side of the first tube 120 may pass the substrate S stacked on the substrate holder 130 and be exhausted to the other side of the first tube 120. Here, when the substrate holder 130 rotates by operation of the rotation driving part 183, the gases passing through the substrate holder 130 may be mixed with each other and uniformly distributed on an area on the substrate S. Thus, a film deposited on the substrate S may be improved in quality.

Alternatively, the rotation driving part 183 may be connected to the lower portion of the substrate holder 130. Thus, while the rotation driving part 183 vertically moves together with the substrate holder 130 according to operation of the vertical driving part 182, the substrate holder 130 may rotate. However, connection structures between the rotation driving part 183, the vertical driving part 183, and the substrate holder 130 may not be limited thereto and vary.

The support plate 184 is disposed on the shaft 181. The support plate 184 may ascend together with the substrate holder 130 to seal a process space in the second tube 160 or the first tube 120 from the outside. The support plate 184 is disposed to be spaced apart from the lower portion of the substrate holder 130. Also, a sealing member 184a having an O-ring shape may be disposed between the support plate 184 and the second tube 160 or between the support plate 184 and the first tube 120 to seal the process space. A bearing member 184b is disposed between the support plate 184 and the shaft 181. The shaft 181 may rotate in a state at which the shaft 181 is supported by the bearing member 184b.

Referring to FIG. 3, the gas supply unit 140 may be connected to the first tube 120 to supply the processing gas into the first tube 120. The gas supply unit 140 includes the main injection holes 141 respectively defined in the first tube 120 with respect to the processing spaces in a vertical direction. Also, the gas supply unit 140 may further include a plurality of auxiliary injection holes 142 respectively defined with respect to the processing spaces in a spiral shape along a circumference of the first tube 120. Also, the gas supply unit 140 may include a main gas supply line 143, a main gas supply source 145, an auxiliary gas supply line 144, and an auxiliary gas supply source 146.

The main gas supply line 143 has one end that is connected to the main injection hole 141 and the other end that is connected to the main gas supply source 145. Thus, a main gas supplied from the main gas supply source 146 may be supplied to the main injection hole 141 through the main gas supply line 143 and injected to the substrate S in the first tube 120.

The main gas may include one or more kinds of gases. For example, the main gas may include at least any one of a silicon gas, an etching gas, and a carrier gas. As the silicon gas, a gas that mainly forms a silicon thin film such as silane (SiH4) and dichlorosilane (DCS) may be used. Also, as the etching gas, hydrochloric acid (HCl) may be used, and as the carrier gas, hydrogen (H2) may be used. Here, the carrier gas may dilute concentration of the silicon gas and the etching gas. Since the silicon gas, the etching gas, and the carrier gas have molecular weights different from each other, when the silicon gas, the etching gas, and the carrier gas are supplied at the same time, they may be easily mixed with each other.

The main gas supply source 145 may be provided as much as the kind of gas included in the main gas. For example, in the current embodiment, a silicon gas supply source 145a, a main etching gas supply source 145b, and a main carrier gas supply source 145c may be provided. Main gas control valves 147a, 147b, and 147c capable of controlling flow rates of the gases are disposed in the supply sources 145a, 145b, and 145c, respectively. Also, the main gas supply line 143 has the other end that is divided into plurality, and the divided other ends are connected to the supply sources 145a, 145b, and 145c, respectively. That is, moving paths of the silicon gas, the etching gas, and the carrier gas which are separately provided may be combined with each other and connected to the main injection hole 141.

The auxiliary gas supply line 144 has one end that is divided to be connected to each of the plurality of auxiliary injection holes 142 and the other end that is connected to the auxiliary gas supply source 146. Thus, an auxiliary gas supplied from the auxiliary gas supply source 146 may be supplied to the auxiliary injection hole 142 through the auxiliary gas supply line 144 and thus be injected to the substrate S in the first tube 120.

The auxiliary gas may include one or more kinds of gases. For example, the auxiliary gas may include at least any one of a dopant gas, an etching gas, and a carrier gas. Here, the carrier gas may dilute concentration of the dopant gas and the etching gas. Since the dopant gas, the etching gas, and the carrier gas may have molecular weights different from each other, when the dopant gas, the etching gas, and the carrier gas are supplied at the same time, they may be easily mixed with each other. Also, the auxiliary gas may control concentration of the main gas. Thus, a component of gas in the processing space may be adjusted by using the auxiliary gas, and thus a processing environment may be appropriately created according to the substrate S.

The auxiliary gas supply source 146 is provided as much as the kind of gas included in the auxiliary gas. For example, in the current embodiment, the auxiliary gas supply source 146 includes a dopant gas supply source 146a, an auxiliary etching gas supply source 146b, and an auxiliary carrier gas supply source 146c. Auxiliary gas control valves 148a, 148b, and 148c capable of controlling flow rates of the gases may be disposed in the supply sources 146a, 146b, and 146c, respectively. Thus, a gas to be supplied to the processing space may be selected by using the auxiliary gas control valve 148a, 148b, and 148c.

For example, when only the dopant gas is supplied to the processing space, only the control valve 148a of the dopant gas supply source 146a may be opened, and the control valve 148b of the auxiliary etching gas supply source 146b and the control valve 148c of the auxiliary carrier gas supply source 146c may be closed. Also, when the etching gas and the carrier gas are supplied to the processing space, the control valve 148b of the auxiliary etching gas supply source 146b and the control valve 148c of the auxiliary carrier gas supply source 146c may be opened, and the control valve 148a of the dopant gas supply source 146a may be closed.

Thus, one or more gases may be selected through the auxiliary gas control valves 148a, 148b, and 148c to use the selected gas as a second gas.

Also, the other end of the auxiliary gas supply line 144 is divided into plurality, and the plurality of other ends are connected to the supply sources 146a, 146b, and 146c, respectively. That is, moving paths of the dopant gas, the etching gas, and the carrier gas which are separately provided are combined with each other and then be re-divided to be connected to the plurality of auxiliary injection holes 142, respectively. A flow rate valve 144a is disposed in each of the moving paths (the auxiliary gas supply line) that will be divided and individually connected to each of the plurality of injection holes 141. Thus, an amount of second gas supplied to each of the processing space may be independently controlled by using the flow rate valve 144a.

Here, a gas injection amount of the auxiliary injection hole 142 is about 30% or less of that of the main injection hole 141. The exhaust hole 151 of the exhaust unit 150 is defined to face and correspond to the main injection hole 141, not to the auxiliary injection holes 142 that are spirally defined. Thus, the gas injected from the auxiliary injection hole 142 that is not symmetric to the exhaust hole 151 with respect to the vertical central axis of the first tube 120 may be introduced into the exhaust hole 151 without being uniformly distributed on the substrate S in the processing space. Thus, when an amount of gas injected from the auxiliary injection hole 142 is about 30% more than that of gas injected from the main injection hole 141, the gas may not be uniformly distributed over an entire area of the substrate S. Therefore, a thin film formed on the substrate S may be deteriorated in quality.

Also, the gas injected from the auxiliary injection hole 142 may disturb a flow of the gas injected from the main injection hole 141 to disrupt the uniform supply of gas onto the substrate S. Thus, when an amount of gas injected from the auxiliary injection hole 142 is about 30% more than that of gas injected from the main injection hole 141, the gas in the processing space may not uniformly flow, and thus a thin film having a uniform thickness may not be formed on the substrate S.

Thus, to uniformly distribute the gas on the substrate S while stably maintaining the flow of the gas in the processing space, the amount of gas injected from the auxiliary injection hole 142 has to be less than that of the gas injected from the main injection hole 141. However, the structure of the gas supply unit 140 and the kind of gas supplied from the gas supply unit 140 may not be limited thereto. That is, the gas supply unit 140 may have various structures, and various kinds of gases may be supplied from the gas supply unit 140. Also, the auxiliary injection hole 142 and the auxiliary gas supply line 144 may be omitted.

Referring to FIGS. 4 to 6, the exhaust unit 150 may exhaust the gas that is injected from the gas supply unit 140 to the processing space in the first tube 120 to the outside. The exhaust unit 150 includes a plurality of exhaust holes 151 defined in a line to correspond to the processing spaces to face the main injection holes 141. Also, the exhaust unit 150 may include an exhaust duct 152 having a path through which the gas moves therein and that is disposed outside the first tube 120 and an exhaust line 153 connected to the exhaust duct 152 to absorb the gas.

The exhaust holes 151 are defined in the first tube 120 to communicate the processing spaces in the first tube 120 with the inside of the exhaust duct. Also, the plurality of exhaust holes 151 are vertically defined in a line to face and correspond to the main injection holes 141. For example, the exhaust holes 151 are defined symmetrical to the main injection holes 141 with respect to the vertical central axis of the first tube 120. The exhaust hole 151 may extend in a direction that crosses a direction in which the substrates S are stacked. For example, the exhaust hole 151 may have a slit shape as shown in FIG. 4. Alternatively, the exhaust holes 151 may be defined as a plurality of holes (not shown) arranged in a line in a direction that crosses the stacking direction of the substrates S.

Since the exhaust holes 151 are defined to correspond to the processing spaces, respectively, the processing spaces may be isolated from each other and independently create an environment for processing the substrate S. Thus, environments in the processing space may be individually controlled depending on condition of the thin film of the substrate S, and thus a thin film may be improved in quality.

Also, since the plurality of exhaust holes 151 are defined in a line, the exhaust duct 152 for covering the plurality of exhaust holes 151 may be easily provided. That is, when the plurality of exhaust holes 151 are not defined in a line, the exhaust duct 152 is provided along an arrangement of the exhaust holes 151 that are curvedly defined, and thus the exhaust duct 152 may be complicated in structure. However, since the exhaust holes 151 are defined in a line, the exhaust duct 152 may be simplified in structure and easily installed.

Although the plurality of exhaust holes 151 isolate the plurality of processing spaces from each other, the plurality of exhaust holes 151 communicate with one exhaust duct 152, and thus the equipment may be simplified in structure when compared to a case in which a plurality of exhaust-suction lines are provided for the plurality of exhaust holes 151, respectively. Thus, the equipment may be improved in space efficiency, and the maintenance of the equipment may be easy.

Here, the exhaust holes 151 may be vertically arranged with widths that gradually increase upward at an angle of about 10° to about 35° with respect to the vertical central axis of the first tube 120. Alternatively, the plurality of holes in which the exhaust holes 151 are defined may be vertically arranged with widths that gradually increase upward at an angle of about 10° to about 35° in a direction crossing the stacking direction of the substrates S.

When the exhaust holes 151 are vertically arranged with widths that gradually increase upward at an angle of about 10° or less, the width of each of the exhaust holes 151 is narrow, and thus the gas may flow fast on a central portion of the substrate S and flow slowly on an outer portion of the substrate S. Thus, since the gas is smoothly supplied to the central portion of the substrate S but is not smoothly supplied to the outer portion of the substrate S, a thin film may not be uniformly formed on the central and outer portions of the substrate S. Therefore, the thin film may be deteriorated in quality.

When the exhaust holes 151 are vertically arranged with widths that gradually increase upward at an angle exceeding about 35° in the direction crossing the stacking direction of the substrates S, the main gas and the auxiliary gas may be directly exhausted through the widened exhaust hole 151 without being sufficiently distributed on the substrate S in the processing space. Thus, the gas may be smoothly supplied to the outer portion of the substrate S but not be smoothly supplied to the central portion of the substrate S, and thus a thin film on the central portion of the substrate S may have a thickness less than that the thin film on the outer portion of the substrate S. Therefore, a difference in film thickness between the thin film on the central portion of the substrate and the thin film on the outer portion of the substrate may occur to deteriorate quality of the thin film.

Thus, as shown in FIG. 7, when the exhaust holes 151 are vertically arranged with widths that gradually increase upward at an angle of about 10° to about 35° with respect to the vertical central axis of the first tube 120, the flow rate of the gas moving through the central portion on the substrate S may be the same as that of the gas moving through the outer portion on the substrate S. That is, the flow rate of the gas may be uniformly maintained over an entire area on the substrate S. Thus, the gas may be evenly distributed on the substrate S to uniformly form the thickness of the thin film over the entire area of the substrate S. Therefore, the thin film may be improved in quality.

Also, the exhaust holes 151 may be arranged with heights. The heights of the exhaust holes 151 may decrease as the widths of the exhaust holes 151 increase and may increase as the widths of the exhaust holes 151 decrease. That is, the heights and widths of the exhaust holes 151 may be inverse proportion to each other. When the widths of the exhaust holes 151 decrease too much, the exhaust holes 151 may be reduced in area, and thus the flow rate of the gas to be introduced through the exhaust holes 151 may be reduced. Thus, the gas in the first tube 120 may not be smoothly exhausted to the outside. Therefore, if the exhaust hole 151 have relatively small widths, the heights of the exhaust holes 151 may increase to minimize reduction of the areas of the exhaust holes 151.

On the contrary, when the widths of the exhaust holes 151 increase too much, the gas in the first tube 120 may be introduced into the exhaust holes 151 without being uniformly distributed on the substrate S, and thus the substrate processing process may not be smoothly performed. Thus, the heights of the exhaust holes 151 may decrease to reduce the flow rate of the gas to be introduced through the exhaust holes 151. Therefore, the widths and heights of the exhaust holes 151 may be determined in consideration of a volume in the first tube 120 and the flow rate of the gas. However, the exhaust hole 151 may not be limited to the above-described structures and shapes. That is, the exhaust hole 151 may have various structures and shapes.

The exhaust hole may have various structures. That is, as illustrated in FIG. 5, a plurality of exhaust holes 151' may be arranged in widths that gradually increase in a direction crossing the stacking direction of the substrate S as the exhaust holes 151' are away from a portion at which the exhaust duct 152 is connected to the exhaust line 153. For example, when the exhaust line 153 is connected to a lower portion of the exhaust duct 152 to suction the gas downward in the exhaust duct 152 from an upper side, the exhaust hole defined at an upper side may have a size greater than that of the exhaust hole defined at a lower side.

That is, the exhaust hole defined adjacent to the exhaust line 153 may have a relatively great suction force. On the other hand, the exhaust holes away from the exhaust line 153 may have relatively weak suction forces. Therefore, the exhaust hole may be adjusted in size to minimize a phenomenon in which a difference in suction force of the gas in the processing chamber occurs depending on the variation of distance between the exhaust hole and the exhaust line 153.

Also, as illustrated in FIG. 6, the exhaust unit 150 may further include at least one auxiliary hole 155 defined in a side surface of the exhaust hole 151 to correspond to the auxiliary injection hole 142. That is, when the amount of gas injected from the auxiliary injection hole 142 is about 30% more than that of gas injected from the main injection hole 141, the auxiliary hole 155 corresponding to the auxiliary injection hole 142 may be provided so that the gas is evenly distributed on the substrate S. The auxiliary hole 155 may allow the processing space to communicate with the exhaust duct 152. That is, the auxiliary hole 155 may be provided to improve the flow of the auxiliary gas supplied through the auxiliary injection hole 142 so that the auxiliary gas is uniformly distributed on the substrate S.

Referring to FIG. 8, the exhaust duct 152 is disposed on an outer wall of the first tube 120. The exhaust duct 152 is disposed between the first tube 120 and the second tube 160. The exhaust duct 152 includes a body part 152a that vertically extends to define a passage through which the gas moves therein and is disposed to correspond to the exhaust holes 151 and a connection part 152b connected to a lower portion of the body part 152a to communicate with the body part. The connection part 152b has a lower portion that is opened.

The body part 152a may have a rectangular parallelepiped shape having an internal space. The body part 152a is disposed to surround the exhaust holes 151 or the exhaust holes 151 and the auxiliary holes 155. Also, the body part 152a has an opened lower portion. Thus, the gas introduced from the processing space through the exhaust hole 151 moves downward along the body part 152a of the exhaust duct 152.

The connection part 152b has a width that is greater than that of the body part 152a in a direction crossing the stacking direction of the substrates S. Also, the opened lower portion of the connection part 152b may communicate with an upper portion of the exhaust port 153b of the exhaust line 153 which will be described later. The connection part 152b has a shape corresponding to that of the upper portion of the exhaust port 153b. That is, the exhaust line 153 may have a shape capable of easily providing a suction force into the exhaust duct 152. Thus, the gas introduced into the body part 152a of the exhaust duct 152 may pass through the connection part 152b and be suctioned into the exhaust port 153b. Here, the connection part 152b of the exhaust duct 152 may have the width that is greater than that of the body part 152a to allow the exhaust line 153 to easily suction the gas in the exhaust port 153b.

Also, the exhaust duct 152 may be formed of quartz and integrated with the first tube 120. Since it is possible that the gas introduced into the exhaust duct 152 contaminates the inside of the substrate processing apparatus 100, the exhaust duct 152 may prevent the gas from diffusing in a space between the first tube 120 and the second tube 160 and guide the gas so that the gas is suctioned into the exhaust line 153.

According to the related art, the gas passes through a whole space between the first tube 120 and the second tube 160 and is suctioned into the exhaust line 153. Thus, the space between the first tube 120 and the second tube 160 is easily contaminated by the gas passing therethrough. In particular, when a selective epitaxial process is performed, since an etching gas is included in the gas, the equipment may be contaminated by the etching gas and broken. Thus, the exhaust duct 152 allows an area in which the gas suctioned from the space between the first tube 120 and the second tube 160 to the exhaust line 153 moves to decrease, thereby reducing an area contaminated by the gas. That is, only the internal space of the exhaust duct 152 may be contaminated by the gas not the whole space between the first tube 120 and the second tube 160. Thus, when the equipment is contaminated or broken by the gas, only the exhaust duct 152 is required to be repaired, and thus the maintenance of the equipment may be easy.

Since the inside of the exhaust duct 152 is easily contaminated, the exhaust duct 152 may be formed of quartz to minimize contamination of the exhaust duct 152. The exhaust duct 152 and the first tube 120 may be separately provided. Thus, when the exhaust duct 152 is contaminated or broken, only the exhaust duct 152 may be separated from the first tube 120 and replaced. However, the exhaust duct 152 may not be limited to the above-described shape and material and have various shapes and materials.

Referring to FIGS. 3 and 7, the exhaust line 153 includes a flange 153a connected to the first tube 120 and the lower portion of the exhaust duct 152, the exhaust port 153b disposed on the flange 153a and having one side that communicates with the connection part 152b of the exhaust duct 152, an exhaust tube 153c having one end that is connected to the other side of the exhaust port 153b, a control valve 153d disposed in the exhaust tube 153c to control a flow rate of a gas in the exhaust tube 153c, and an exhaust pump 153e connected to the other end of the exhaust tube 153c to suction the gas. Also, the exhaust line 153 includes a path switching tube 153f having one end that is connected to the exhaust tube 153c between the control valve 153d and the exhaust pump 153e and the other end that is connected to the gas supply unit 140 and a path switching valve 153g disposed between the path switching tube 153f and the exhaust tube 153c to switch the moving path of the gas.

The flange 153a has a shape corresponding to that of the first tube 120. For example, the flange 153a may have a donut shape and be connected to the lower portion of the first tube 120. Thus, the flange 153a may support the first tube 120.

The exhaust port 153b is disposed on the flange 153a to communicate with the lower portion of the exhaust duct 152. For example, the exhaust port 153b may have a 'L' shape and pass through a side surface and upper portion of the flange 153a. The exhaust port 153b has an opened upper portion and an opened side surface. Thus, the gas introduced from the upper portion of the exhaust port 153b communicating with the exhaust duct 152 may move along the exhaust port 153b in a side surface-direction.

The exhaust tube 153c defines a path through which the gas moves. The exhaust tube 153c has one end that is connected to the opened side surface of the exhaust port 153b. Thus, the gas moving through the exhaust port 153b may be introduced into the exhaust tube 153c.

The exhaust pump 153e may be connected to the other end of the exhaust tube 153c and provide a suction force of the gas. Thus, the gas in the first tube 120 may pass through the exhaust duct 152, the exhaust port 153b, and the exhaust tube 153c and be exhausted by the exhaust pump 153e.

The control valve 153d may be disposed in the exhaust tube 153c to control the flow rate of the gas moving to the exhaust pump 153e. Thus, when the control valve 153d is opened, the exhaust unit 150 may exhaust the gas in the first tube 120 to the outside, and when the control valve 153d is closed, the exhaust unit 150 may stop exhausting the gas in the first tube 120 to the outside. Also, when the control valve 153d is adjusted in openable degree, an amount of gas suctioned in the first tube 120 may be controlled.

The path switching tube 153f defines a path through which the gas moves. The path switching tube 153f has one end that is connected to the exhaust tube 153c between the control valve 153d and the exhaust pump 153e and the other end that is connected to the other end of the main gas supply line 143 and the other end of the auxiliary gas supply line 144. Thus, the gas moving through the exhaust tube 153c may be supplied toward the gas supply unit through the path switching tube 153f and thus be re-injected into the first tube 120.

Also, supply valves 153h may be disposed in a connection portion of the path switching tube 153f and the main gas supply line 143 and a connection portion of the path switching tube 153f and the auxiliary gas supply line 144, respectively. Thus, the supply valves 153h may individually control flow rates of the gases supplied to the main gas supply line 143 and the auxiliary gas supply line 144 through the path switching tube 153f.

The path switching valve 153g may be disposed in the connection portion of the exhaust tube 153c and the path switching tube 153f to switch the flow of the gas toward the exhaust pump 153e and toward the gas supply unit 140. Thus, in an initial substrate processing process, the path switching valve 153g may send the gas introduced from the exhaust duct toward the gas supply unit 140. When the substrate processing process is stabilized, the path switching valve 153g may send the gas introduced from the exhaust duct toward the exhaust pump 153e. Like this, exhaust operation may be performed. However, the exhaust line 153 may not be limited to the above-described structure. That is, the exhaust line 153 may have various structures.

A position determining unit (not shown) may be disposed on a bottom surface of the connection part 152b of the exhaust duct 152 and a top surface of the flange 153a. For example, a protrusion may protrude upward from the top surface of the flange 153a, and a groove to which the protrusion is inserted may be defined in the bottom surface of the connection part 152b. Alternatively, a protrusion may protrude downward from the bottom surface of the connection part 152b, and a groove to which the protrusion is inserted may be defined in the top surface of the flange 153a. Thus, the exhaust duct 152 may be coupled and fixed to the flange 153a by the protrusion and the groove.

Like this, the flow rate of the gas introduced into the processing space in which the substrate S is processed may be controlled so that the gas flows fast at an upper side of the central portion of the substrate S where the gas flows slowly, and the gas flows slowly at an upper side of the outer portion of the substrate S where the gas flows fast. Thus, since the gas uniformly flows over an entire area on the substrate S, the gas may be uniformly distributed over the entire area on the substrate S. Therefore, when a thin film is deposited on the substrate S by using the gas, the substrate S that is produced in such a way that a thin film grows in a uniform thickness over an entire area on the substrate S or a thin film on the substrate S may be improved in quality.

Also, the exhaust duct 152 may be provided to prevent the equipment from being contaminated by the gas. That is, since the moving path of the gas that contaminates the equipment is limited to the inside of the exhaust duct 152, a phenomenon in which other parts of the equipment are contaminated by the gas may be prevented. Therefore, the maintenance of the equipment may be easy.

Although the substrate processing apparatus has been described with reference to the specific embodiments, it is not limited thereto. Therefore, it will be readily understood by those skilled in the art that various modifications and changes can be made thereto without departing from the spirit and scope of the present invention defined by the appended claims.

What is claimed is:
1. A substrate processing apparatus comprising:
a first tube defining an inner space;

a substrate holder in which a plurality of substrates are vertically stacked in the inner space of the first tube, the substrate holder separately defining a plurality of processing spaces in which the substrates are individually processed;

a gas supply unit having a plurality of main injection holes each of which is vertically defined to correspond to each of the processing spaces to supply a gas into the first tube; and an exhaust unit configured to exhaust the gas supplied into the plurality of processing spaces in the first tube to the outside, wherein the exhaust unit comprises a plurality of exhaust holes facing the main injection holes and vertically arranged in a line to correspond to the processing spaces, an exhaust duct disposed outside the first tube, the exhaust duct comprising a body part that vertically extends to define a passage through which the gas moves therein, the body part being disposed at a position corresponding to the exhaust holes;

a connection part connected to a lower portion of the body part to communicate with the body part, the connection part having an opened lower portion;

an exhaust line connected to the exhaust duct to suction the gas, wherein the plurality of exhaust holes are arranged in widths gradually increasing in a direction that crosses a stacking direction of the substrate as the exhaust holes are away from a portion at which the exhaust duct is connected to the exhaust line.

2. The substrate processing apparatus of claim 1, wherein the exhaust holes are provided as one hole having a slit shape extending in a direction that crosses the stacking direction of the substrates, or the exhaust holes comprise a plurality of holes arranged in the direction that crosses the stacking direction of the substrates.

3. The substrate processing apparatus of claim 1, wherein the exhaust holes have widths in the direction that crosses the stacking direction of the substrates at an angle of equal to 35° or less with respect to a vertical central axis of the first tube, and the exhaust holes are arranged symmetrical to the main injection holes with respect to the central axis.

4. The substrate processing apparatus of claim 1, wherein the exhaust line comprises:

a flange connected to a lower portion of each of the first tube and the exhaust duct;

an exhaust port disposed on the flange, the exhaust port having one side that communicates with the connection part of the exhaust duct;

an exhaust tube having one end that is connected to the other side of the exhaust port;

a control valve disposed in the exhaust tube to control a flow rate of the gas in the exhaust tube; and an exhaust pump connected to the other end of the exhaust tube to suction the gas.

5. The substrate processing apparatus of claim 4, wherein the exhaust line further comprises:

a path switching tube having one end that is connected to the exhaust tube between the control valve and the exhaust pump and the other end that is connected to the gas supply unit; and a path switching valve disposed between the path switching tube and the exhaust tube to switch paths through which the gas moves therebetween.

6. The substrate processing apparatus of claim 4, further comprising a position determining unit formed on a bottom surface of the connection part and a top surface of the flange.

7. The substrate processing apparatus of claim 1, wherein the gas supply unit further comprises a plurality of auxiliary injection holes spirally defined to correspond to the processing spaces along a circumference of the first tube.

8. The substrate processing apparatus of claim 7, wherein an amount of gas injected through each of the auxiliary injection holes is equal to 30% or less of that of gas injected through the plurality of main injection holes.

9. The substrate processing apparatus of claim 7, wherein the exhaust unit further comprises an auxiliary hole defined in a side surface of the exhaust hole to correspond to the auxiliary injection hole.

10. The substrate processing apparatus of claim 1, further comprising a second tube having an inner space to accommodate the first tube, wherein the exhaust duct is disposed between the first tube and the second tube.

11. The substrate processing apparatus of claim 1, wherein the exhaust duct is formed of quartz and is integrated with the first tube.

* * * * *